(12) United States Patent
Hong et al.

(10) Patent No.: US 8,975,152 B2
(45) Date of Patent: Mar. 10, 2015

(54) METHODS OF REDUCING SUBSTRATE DISLOCATION DURING GAPFILL PROCESSING

(71) Applicant: Applied Materials, Inc., Santa Clara, CA (US)

(72) Inventors: Sukwon Hong, San Jose, CA (US); Hiroshi Hamana, Hyogo (JP); Jingmei Liang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 299 days.

(21) Appl. No.: 13/669,184

(22) Filed: Nov. 5, 2012

(65) Prior Publication Data

US 2013/0309870 A1    Nov. 21, 2013

Related U.S. Application Data

(60) Provisional application No. 61/557,249, filed on Nov. 8, 2011.

(51) Int. Cl.
*H01L 21/76* (2006.01)
*H01L 21/311* (2006.01)
(Continued)

(52) U.S. Cl.
CPC ........ *H01L 21/306* (2013.01); *H01L 21/02164* (2013.01); *H01L 21/02274* (2013.01); *H01L 21/02326* (2013.01); *H01L 21/02337* (2013.01); *H01L 21/76229* (2013.01)
USPC ........... 438/427; 438/424; 438/425; 438/435; 438/589; 438/700; 257/E21.546; 257/E21.549; 257/E21.55; 257/E21.632

(58) Field of Classification Search
USPC ................. 438/424, 425, 427, 435, 589, 700; 257/E21.546, E21.549, E21.55, 257/E21.632
See application file for complete search history.

(56) References Cited

U.S. PATENT DOCUMENTS 2,369,620 A    2/1945  Sullivan et al.
3,451,840 A    6/1969  Hough
(Continued)

FOREIGN PATENT DOCUMENTS

CN    1375575        10/2002
CN    1412861 A    4/2003
(Continued)

OTHER PUBLICATIONS

Abraham, "Reactive Facet Tapering of Plasma Oxide for Multilevel Interconnect Applications", IEEE, V-MIC Conference, Jun. 15-16, 1987, pp. 115-121.
(Continued)

*Primary Examiner* — Mohsen Ahmadi
(74) *Attorney, Agent, or Firm* — Kilpatrick Townsend & Stockton LLP

(57) ABSTRACT

Methods of reducing dislocation in a semiconductor substrate between asymmetrical trenches are described. The methods may include etching a plurality of trenches on a semiconductor substrate and may include two adjacent trenches of unequal width separated by an unetched portion of the substrate. The methods may include forming a layer of dielectric material on the substrate. The dielectric material may form a layer in the trenches located adjacent to each other of substantially equivalent height on both sides of the unetched portion of the substrate separating the two trenches. The methods may include densifying the layer of dielectric material so that the densified dielectric within the two trenches of unequal width exerts a substantially similar stress on the unetched portion of the substrate that separates them.

16 Claims, 4 Drawing Sheets

(51) Int. Cl.
  *H01L 21/3205* (2006.01)
  *H01L 21/306* (2006.01)
  *H01L 21/02* (2006.01)
  *H01L 21/762* (2006.01)

(56) References Cited

U.S. PATENT DOCUMENTS

| | | |
|---|---|---|
| 3,937,857 A | 2/1976 | Brummett et al. |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory et al. |
| 4,234,628 A | 11/1980 | DuRose |
| 4,265,943 A | 5/1981 | Goldstein et al. |
| 4,364,803 A | 12/1982 | Nidola et al. |
| 4,368,223 A | 1/1983 | Kobayashi et al. |
| 4,397,812 A | 8/1983 | Mallory, Jr. |
| 4,468,413 A | 8/1984 | Bachmann |
| 4,565,601 A | 1/1986 | Kakehi et al. |
| 4,571,819 A | 2/1986 | Rogers et al. |
| 4,579,618 A | 4/1986 | Celestino et al. |
| 4,585,920 A | 4/1986 | Hoog et al. |
| 4,632,857 A | 12/1986 | Mallory, Jr. |
| 4,656,052 A | 4/1987 | Satou et al. |
| 4,690,746 A | 9/1987 | McInerney et al. |
| 4,714,520 A | 12/1987 | Gwozdz |
| 4,749,440 A | 6/1988 | Blackwood et al. |
| 4,753,898 A | 6/1988 | Parrillo et al. |
| 4,807,016 A | 2/1989 | Douglas |
| 4,810,520 A | 3/1989 | Wu |
| 4,816,638 A | 3/1989 | Ukai et al. |
| 4,851,370 A | 7/1989 | Doklan et al. |
| 4,865,685 A | 9/1989 | Palmour |
| 4,872,947 A | 10/1989 | Wang et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,951,601 A | 8/1990 | Maydan et al. |
| 4,960,488 A | 10/1990 | Law et al. |
| 4,981,551 A | 1/1991 | Palmour |
| 4,985,372 A | 1/1991 | Narita |
| 4,994,404 A | 2/1991 | Sheng et al. |
| 5,000,113 A | 3/1991 | Wang et al. |
| 5,013,691 A | 5/1991 | Lory et al. |
| 5,030,319 A | 7/1991 | Nishino et al. |
| 5,061,838 A | 10/1991 | Lane et al. |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,186,718 A | 2/1993 | Tepman et al. |
| 5,198,034 A | 3/1993 | deBoer et al. |
| 5,203,911 A | 4/1993 | Sricharoenchalkit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,527 A | 9/1993 | Uchida et al. |
| 5,252,178 A | 10/1993 | Moslehi |
| 5,270,125 A | 12/1993 | America et al. |
| 5,271,972 A | 12/1993 | Kwok et al. |
| 5,275,977 A | 1/1994 | Otsubo et al. |
| 5,279,865 A | 1/1994 | Chebi et al. |
| 5,288,518 A | 2/1994 | Homma |
| 5,290,382 A | 3/1994 | Zarowin et al. |
| 5,302,233 A | 4/1994 | Kim et al. |
| 5,306,530 A | 4/1994 | Stronglin et al. |
| 5,314,724 A | 5/1994 | Tsukune et al. |
| 5,316,804 A | 5/1994 | Tomikawa et al. |
| 5,319,247 A | 6/1994 | Matsuura |
| 5,328,558 A | 7/1994 | Kawamura et al. |
| 5,328,810 A | 7/1994 | Lowrey et al. |
| 5,334,552 A | 8/1994 | Homma |
| 5,345,999 A | 9/1994 | Hosokawa |
| 5,352,636 A | 10/1994 | Beinglass |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,529 A | 3/1995 | Homma |
| 5,403,434 A | 4/1995 | Moslehi |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,468,342 A | 11/1995 | Nulty et al. |
| 5,474,589 A | 12/1995 | Ohga et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,571,576 A | 11/1996 | Qian et al. |
| 5,578,130 A | 11/1996 | Hayashi et al. |
| 5,591,269 A | 1/1997 | Arami et al. |
| 5,599,740 A | 2/1997 | Jang et al. |
| 5,624,582 A | 4/1997 | Cain |
| 5,626,922 A | 5/1997 | Miyanaga et al. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,674,787 A | 10/1997 | Zhao et al. |
| 5,679,606 A | 10/1997 | Wang et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,755,859 A | 5/1998 | Brusic et al. |
| 5,756,402 A | 5/1998 | Jimbo et al. |
| 5,781,693 A | 7/1998 | Ballance et al. |
| 5,786,276 A | 7/1998 | Brooks et al. |
| 5,789,300 A | 8/1998 | Fulford |
| 5,800,686 A | 9/1998 | Littau et al. |
| 5,804,259 A | 9/1998 | Robles |
| 5,812,403 A | 9/1998 | Fong et al. |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,838,055 A | 11/1998 | Kleinhenz et al. |
| 5,843,538 A | 12/1998 | Ehrsam et al. |
| 5,844,195 A | 12/1998 | Fairbairn et al. |
| 5,846,332 A | 12/1998 | Zhao et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,856,240 A | 1/1999 | Sinha et al. |
| 5,858,876 A | 1/1999 | Chew |
| 5,872,052 A | 2/1999 | Iyer |
| 5,872,058 A | 2/1999 | Van Cleemput et al. |
| 5,882,786 A | 3/1999 | Nassau et al. |
| 5,885,404 A | 3/1999 | Kim et al. |

(56) References Cited

U.S. PATENT DOCUMENTS

| | | | |
|---|---|---|---|
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki et al. |
| 5,899,752 A | 5/1999 | Hey et al. |
| 5,904,827 A | 5/1999 | Reynolds |
| 5,907,790 A | 5/1999 | Kellam |
| 5,910,340 A | 6/1999 | Uchida et al. |
| 5,913,140 A | 6/1999 | Roche et al. |
| 5,913,147 A | 6/1999 | Dubin et al. |
| 5,915,190 A | 6/1999 | Pirkle |
| 5,920,792 A | 7/1999 | Lin |
| 5,932,077 A | 8/1999 | Reynolds et al. |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,902 A | 8/1999 | Redeker et al. |
| 5,951,601 A | 9/1999 | Lesinski et al. |
| 5,951,776 A | 9/1999 | Selyutin et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,227 A | 6/2000 | Yau et al. |
| 6,077,780 A | 6/2000 | Dubin |
| 6,080,529 A | 6/2000 | Ye et al. |
| 6,083,344 A | 7/2000 | Hanawa et al. |
| 6,086,677 A | 7/2000 | Umotoy et al. |
| 6,087,278 A | 7/2000 | Kim et al. |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,836 A | 8/2000 | Cohen et al. |
| 6,113,771 A | 9/2000 | Landau et al. |
| 6,117,245 A | 9/2000 | Mandrekar et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,812 B1 | 1/2001 | Hsuing et al. |
| 6,176,198 B1 | 1/2001 | Kao et al. |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,217,658 B1 | 4/2001 | Orczyk et al. |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,752 B1 | 8/2001 | Chen |
| 6,291,348 B1 | 9/2001 | Lopatin et al. |
| 6,312,995 B1 | 11/2001 | Yu |
| 6,313,035 B1 | 11/2001 | Sandhu et al. |
| 6,319,387 B1 | 11/2001 | Krishnamoorthy et al. |
| 6,323,128 B1 | 11/2001 | Sambucetti et al. |
| 6,335,261 B1 | 1/2002 | Natzle et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| 6,344,410 B1 | 2/2002 | Lopatin et al. |
| 6,350,320 B1 | 2/2002 | Sherstinsky et al. |
| 6,351,013 B1 | 2/2002 | Luning et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,372,657 B1 | 4/2002 | Hineman et al. |
| 6,375,748 B1 | 4/2002 | Yudovsky et al. |
| 6,379,575 B1 | 4/2002 | Yin et al. |
| 6,383,951 B1 | 5/2002 | Li |
| 6,387,207 B1 | 5/2002 | Janakiraman et al. |
| 6,395,150 B1 | 5/2002 | Van Cleemput et al. |
| 6,403,491 B1 | 6/2002 | Liu et al. |
| 6,416,647 B1 | 7/2002 | Dordi et al. |
| 6,432,819 B1 | 8/2002 | Pavate et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,462,371 B1 | 10/2002 | Weimer et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,500,728 B1 | 12/2002 | Wang |
| 6,503,843 B1 | 1/2003 | Xia et al. |
| 6,506,291 B2 | 1/2003 | Tsai et al. |
| 6,516,815 B1 | 2/2003 | Stevens et al. |
| 6,527,968 B1 | 3/2003 | Wang et al. |
| 6,528,409 B1 | 3/2003 | Lopatin et al. |
| 6,531,377 B2 | 3/2003 | Knorr et al. |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |

(56) References Cited

U.S. PATENT DOCUMENTS

| | | |
|---|---|---|
| 6,551,924 B1 | 4/2003 | Dalton et al. |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,596,602 B2 | 7/2003 | Iizuka et al. |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,677,242 B1 | 1/2004 | Liu et al. |
| 6,677,247 B2 | 1/2004 | Yuan et al. |
| 6,679,981 B1 | 1/2004 | Pan et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,743,473 B1 | 6/2004 | Parkhe et al. |
| 6,743,732 B1 | 6/2004 | Lin et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,772,827 B2 | 8/2004 | Keller et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,867,141 B2 | 3/2005 | Jung et al. |
| 6,869,880 B2 | 3/2005 | Krishnaraj et al. |
| 6,878,206 B2 | 4/2005 | Tzu et al. |
| 6,879,981 B2 | 4/2005 | Rothschild et al. |
| 6,893,967 B1 | 5/2005 | Wright et al. |
| 6,903,031 B2 | 6/2005 | Karim et al. |
| 6,903,511 B2 | 6/2005 | Chistyakov |
| 6,908,862 B2 | 6/2005 | Li et al. |
| 6,911,112 B2 | 6/2005 | An et al. |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,942,753 B2 | 9/2005 | Choi et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,974,780 B2 | 12/2005 | Schuegraf |
| 7,017,269 B2 | 3/2006 | White et al. |
| 7,030,034 B2 | 4/2006 | Fucsko et al. |
| 7,049,200 B2 | 5/2006 | Arghavani et al. |
| 7,078,312 B1 | 7/2006 | Sutanto et al. |
| 7,081,414 B2 | 7/2006 | Zhang et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,183,214 B2 | 2/2007 | Nam et al. |
| 7,196,342 B2 | 3/2007 | Ershov et al. |
| 7,205,240 B2 | 4/2007 | Karim et al. |
| 7,223,701 B2 | 5/2007 | Min et al. |
| 7,226,805 B2 | 6/2007 | Hallin et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,341,633 B2 | 3/2008 | Lubomirsky et al. |
| 7,390,710 B2 | 6/2008 | Derderian et al. |
| 7,396,480 B2 | 7/2008 | Kao et al. |
| 7,465,358 B2 | 12/2008 | Weidman et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,581,511 B2 | 9/2009 | Mardian et al. |
| 7,628,897 B2 | 12/2009 | Mungekar et al. |
| 7,709,396 B2 | 5/2010 | Bencher et al. |
| 7,722,925 B2 | 5/2010 | White et al. |
| 7,785,672 B2 | 8/2010 | Choi et al. |
| 7,807,578 B2 | 10/2010 | Bencher et al. |
| 7,871,926 B2 | 1/2011 | Xia et al. |
| 7,910,491 B2 | 3/2011 | Soo Kwon et al. |
| 7,915,139 B1 | 3/2011 | Lang et al. |
| 7,939,422 B2 | 5/2011 | Ingle et al. |
| 7,968,441 B2 | 6/2011 | Xu |
| 7,981,806 B2 | 7/2011 | Jung |
| 8,008,166 B2 | 8/2011 | Sanchez et al. |
| 8,058,179 B1 | 11/2011 | Draegar et al. |
| 8,071,482 B2 | 12/2011 | Kawada |
| 8,074,599 B2 | 12/2011 | Choi et al. |
| 8,083,853 B2 | 12/2011 | Choi et al. |
| 8,187,486 B1 | 5/2012 | Liu et al. |
| 8,211,808 B2 | 7/2012 | Sapre et al. |
| 8,309,440 B2 | 11/2012 | Sanchez et al. |
| 8,328,939 B2 | 12/2012 | Choi et al. |
| 8,435,902 B2 | 5/2013 | Tang et al. |
| 2001/0015261 A1 | 8/2001 | Kobayashi et al. |
| 2001/0028922 A1 | 10/2001 | Sandhu |
| 2001/0030366 A1 | 10/2001 | Nakano et al. |
| 2001/0034121 A1 | 10/2001 | Fu et al. |
| 2001/0041444 A1 | 11/2001 | Shields et al. |
| 2002/0011210 A1 | 1/2002 | Satoh et al. |
| 2002/0016080 A1 | 2/2002 | Khan et al. |
| 2002/0016085 A1 | 2/2002 | Huang et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0045966 A1 | 4/2002 | Lee et al. |
| 2002/0054962 A1 | 5/2002 | Huang |
| 2002/0069820 A1 | 6/2002 | Yudovsky |
| 2002/0098681 A1 | 7/2002 | Hu et al. |
| 2002/0177322 A1 | 11/2002 | Li et al. |
| 2002/0187655 A1 | 12/2002 | Tan et al. |
| 2002/0197823 A1 | 12/2002 | Yoo et al. |
| 2003/0010645 A1 | 1/2003 | Ting et al. |
| 2003/0019428 A1 | 1/2003 | Ku et al. |
| 2003/0029566 A1 | 2/2003 | Roth |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0124842 A1 | 7/2003 | Hytros et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0148035 A1 | 8/2003 | Lingampalli |
| 2003/0173333 A1 | 9/2003 | Wang et al. |
| 2003/0173347 A1 | 9/2003 | Guiver |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0221780 A1 | 12/2003 | Lei et al. |

(56) References Cited

U.S. PATENT DOCUMENTS

| | | |
|---|---|---|
| 2003/0224217 A1 | 12/2003 | Byun et al. |
| 2003/0224617 A1 | 12/2003 | Baek et al. |
| 2004/0005726 A1 | 1/2004 | Huang |
| 2004/0033678 A1 | 2/2004 | Arghavani et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0101667 A1 | 5/2004 | O'Loughlin et al. |
| 2004/0110354 A1 | 6/2004 | Natzle et al. |
| 2004/0115876 A1 | 6/2004 | Goundar et al. |
| 2004/0129224 A1 | 7/2004 | Yamazaki |
| 2004/0137161 A1 | 7/2004 | Segawa et al. |
| 2004/0154535 A1 | 8/2004 | Chen et al. |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0211357 A1 | 10/2004 | Gadgil et al. |
| 2004/0219789 A1 | 11/2004 | Wood et al. |
| 2004/0245091 A1 | 12/2004 | Karim et al. |
| 2005/0001276 A1 | 1/2005 | Gao et al. |
| 2005/0003676 A1 | 1/2005 | Ho et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0048801 A1 | 3/2005 | Karim et al. |
| 2005/0090120 A1 | 4/2005 | Hasegawa et al. |
| 2005/0098111 A1 | 5/2005 | Shimizu et al. |
| 2005/0112901 A1 | 5/2005 | Ji et al. |
| 2005/0121750 A1 | 6/2005 | Chan et al. |
| 2005/0181588 A1 | 8/2005 | Kim |
| 2005/0199489 A1 | 9/2005 | Stevens et al. |
| 2005/0205110 A1 | 9/2005 | Kao et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0266622 A1 | 12/2005 | Arghavani et al. |
| 2005/0266691 A1 | 12/2005 | Gu et al. |
| 2005/0287771 A1 | 12/2005 | Seamons et al. |
| 2006/0000805 A1 | 1/2006 | Todorow et al. |
| 2006/0019456 A1 | 1/2006 | Bu et al. |
| 2006/0019486 A1 | 1/2006 | Yu et al. |
| 2006/0024956 A1 | 2/2006 | Zhijian et al. |
| 2006/0033678 A1 | 2/2006 | Lubomirsky et al. |
| 2006/0046419 A1 | 3/2006 | Sandhu et al. |
| 2006/0046484 A1 | 3/2006 | Abatchev et al. |
| 2006/0051966 A1 | 3/2006 | Or et al. |
| 2006/0051968 A1 | 3/2006 | Joshi et al. |
| 2006/0093756 A1 | 5/2006 | Rajagopalan et al. |
| 2006/0102076 A1 | 5/2006 | Smith et al. |
| 2006/0130971 A1 | 6/2006 | Chang et al. |
| 2006/0166107 A1 | 7/2006 | Chen et al. |
| 2006/0166515 A1 | 7/2006 | Karim et al. |
| 2006/0185592 A1 | 8/2006 | Matsuura |
| 2006/0207504 A1 | 9/2006 | Hasebe et al. |
| 2006/0211260 A1 | 9/2006 | Tran et al. |
| 2006/0216923 A1 | 9/2006 | Tran et al. |
| 2006/0240661 A1 | 10/2006 | Annapragada et al. |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0261490 A1 | 11/2006 | Su et al. |
| 2006/0264003 A1 | 11/2006 | Eun |
| 2006/0264043 A1 | 11/2006 | Stewart et al. |
| 2007/0071888 A1 | 3/2007 | Shanmugasundram et al. |
| 2007/0072408 A1 | 3/2007 | Enomoto et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0123051 A1 | 5/2007 | Arghavani et al. |
| 2007/0181057 A1 | 8/2007 | Lam et al. |
| 2007/0197028 A1 | 8/2007 | Byun et al. |
| 2007/0232071 A1 | 10/2007 | Balseanu et al. |
| 2007/0238321 A1 | 10/2007 | Futase et al. |
| 2007/0269976 A1 | 11/2007 | Futase et al. |
| 2007/0281106 A1 | 12/2007 | Lubomirsky et al. |
| 2008/0085604 A1 | 4/2008 | Hoshino et al. |
| 2008/0099431 A1 | 5/2008 | Kumar et al. |
| 2008/0124919 A1 | 5/2008 | Huang et al. |
| 2008/0124937 A1 | 5/2008 | Xu et al. |
| 2008/0142483 A1 | 6/2008 | Hua et al. |
| 2008/0142831 A1 | 6/2008 | Su |
| 2008/0160210 A1 | 7/2008 | Yang et al. |
| 2008/0162781 A1 | 7/2008 | Haller et al. |
| 2008/0182381 A1 | 7/2008 | Kiyotoshi |
| 2008/0182382 A1 | 7/2008 | Ingle et al. |
| 2008/0233709 A1 | 9/2008 | Conti et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2009/0045167 A1 | 2/2009 | Maruyama |
| 2009/0104738 A1 | 4/2009 | Ring et al. |
| 2009/0104764 A1 | 4/2009 | Xia et al. |
| 2009/0104782 A1 | 4/2009 | Lu et al. |
| 2009/0255902 A1 | 10/2009 | Satoh et al. |
| 2009/0269569 A1* | 10/2009 | Fucsko et al. ............... 428/220 |
| 2009/0275205 A1 | 11/2009 | Kiehlbauch et al. |
| 2009/0275206 A1 | 11/2009 | Katz et al. |
| 2010/0059889 A1 | 3/2010 | Gosset et al. |
| 2010/0075503 A1 | 3/2010 | Bencher et al. |
| 2010/0093151 A1 | 4/2010 | Arghavani et al. |
| 2010/0098884 A1 | 4/2010 | Balseanu et al. |
| 2010/0099236 A1 | 4/2010 | Kwon et al. |
| 2010/0099263 A1 | 4/2010 | Kao et al. |
| 2010/0105209 A1 | 4/2010 | Winniczek et al. |
| 2010/0173499 A1 | 7/2010 | Tao et al. |
| 2010/0187534 A1 | 7/2010 | Nishi et al. |
| 2011/0008950 A1 | 1/2011 | Xu |
| 2011/0053380 A1 | 3/2011 | Sapre et al. |
| 2011/0081782 A1* | 4/2011 | Liang et al. ............... 438/697 |
| 2011/0143542 A1 | 6/2011 | Feurprier et al. |
| 2011/0151674 A1 | 6/2011 | Tang et al. |
| 2011/0151676 A1 | 6/2011 | Ingle et al. |
| 2011/0151677 A1 | 6/2011 | Wang et al. |
| 2011/0165771 A1 | 7/2011 | Ring et al. |
| 2011/0226734 A1 | 9/2011 | Sumiya et al. |
| 2011/0230052 A1 | 9/2011 | Tang et al. |
| 2011/0266252 A1 | 11/2011 | Thadani et al. |
| 2011/0294300 A1 | 12/2011 | Zhang et al. |
| 2012/0009796 A1 | 1/2012 | Cui et al. |
| 2012/0196447 A1 | 8/2012 | Yang et al. |
| 2012/0211462 A1 | 8/2012 | Zhang et al. |
| 2012/0238102 A1 | 9/2012 | Zhang et al. |
| 2012/0238103 A1 | 9/2012 | Zhang et al. |
| 2012/0282777 A1* | 11/2012 | Shih et al. ............... 438/702 |
| 2012/0285621 A1 | 11/2012 | Tan |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0059440 A1 | 3/2013 | Wang et al. |
| 2013/0089988 A1 | 4/2013 | Wang et al. |

FOREIGN PATENT DOCUMENTS

| | | |
|---|---|---|
| CN | 101465386 A | 6/2009 |
| EP | 0329406 | 8/1989 |
| EP | 0376252 | 7/1990 |
| EP | 0475567 | 3/1992 |
| EP | 0 496 543 A2 | 7/1992 |
| EP | 0 658 928 A1 | 6/1995 |
| EP | 0697467 | 2/1996 |
| EP | 0913498 | 5/1999 |
| EP | 1099776 | 5/2001 |
| EP | 1107288 | 6/2001 |
| EP | 1496542 | 1/2005 |
| EP | 1568797 | 8/2005 |
| GB | 2285174 | 6/1995 |
| JP | 2058836 A | 2/1990 |
| JP | 02-121330 | 5/1990 |

(56) References Cited

FOREIGN PATENT DOCUMENTS

| | | |
|---|---|---|
| JP | 02256235 | 10/1990 |
| JP | 4-239750 | 7/1992 |
| JP | 4-341568 A | 11/1992 |
| JP | 07-130713 A | 5/1995 |
| JP | 7297543 | 11/1995 |
| JP | 08-306671 | 11/1996 |
| JP | 09153481 A | 6/1997 |
| JP | 09-205140 A | 8/1997 |
| JP | 10-178004 | 6/1998 |
| JP | 11124682 | 5/1999 |
| JP | H11-204442 | 7/1999 |
| JP | 2000-012514 | 1/2000 |
| JP | 2001-308023 | 11/2001 |
| JP | 2002-100578 | 4/2002 |
| JP | 2002-141349 | 5/2002 |
| JP | 2002-222861 | 8/2002 |
| JP | 2002-256235 | 9/2002 |
| JP | 2003-019433 | 1/2003 |
| JP | 2003-059914 | 2/2003 |
| JP | 2003-179038 | 6/2003 |
| JP | 2003-217898 | 7/2003 |
| JP | 2003-318158 | 11/2003 |
| JP | 2003-347278 | 12/2003 |
| JP | 2004-047956 | 2/2004 |
| JP | 2004-156143 | 6/2004 |
| JP | 04-239723 A | 8/2004 |
| JP | 2005-033023 A | 2/2005 |
| JP | 2007-173383 | 7/2007 |
| JP | 08-148470 A | 6/2008 |
| JP | 2010-154699 | 8/2010 |
| KR | 10-0155601 | 12/1998 |
| KR | 10-0236219 | 12/1999 |
| KR | 2000-0044928 | 7/2000 |
| KR | 2001-0014064 | 2/2001 |
| KR | 10-2001-0049274 | 6/2001 |
| KR | 10-2001-0058774 A | 7/2001 |
| KR | 10-2001-0082109 | 8/2001 |
| KR | 1020030096140 | 12/2003 |
| KR | 10-2004-0049739 | 6/2004 |
| KR | 10-2004-0096365 A | 11/2004 |
| KR | 10-2010-0013980 | 2/2010 |
| KR | 10-2010-0074508 A | 7/2010 |
| KR | 10-1050454 | 7/2011 |
| WO | 92/20833 A1 | 11/1992 |
| WO | 99/54920 | 10/1999 |
| WO | 99/62108 A2 | 12/1999 |
| WO | 00/13225 A1 | 3/2000 |
| WO | 00/22671 | 4/2000 |
| WO | 01/94719 | 12/2001 |
| WO | 02083981 | 10/2002 |
| WO | 03014416 | 2/2003 |
| WO | 2004/006303 | 1/2004 |
| WO | 2004/074932 | 9/2004 |
| WO | 2004/114366 A2 | 12/2004 |
| WO | 2005036615 | 4/2005 |
| WO | 2006/069085 A2 | 6/2006 |
| WO | 2009/071627 | 6/2009 |
| WO | 2011/087580 A1 | 7/2011 |
| WO | 2011/115761 A2 | 9/2011 |
| WO | 2011/139435 A2 | 11/2011 |
| WO | 2012/018449 A2 | 9/2012 |
| WO | 2012/125654 A2 | 9/2012 |

OTHER PUBLICATIONS

Applied Materials, Inc., "Applied Siconi™ Preclean," printed on Aug. 7, 2009, 8 pages.

Carlson, et al., "A Negative Spacer Lithography Process for Sub-100nm Contact Holes and Vias", University of California at Berkeley, Jun. 19, 2007, 4 pp.

Chang et al. "Frequency Effects and Properties of Plasma Deposited Fluorinated Silicon Nitride", J. Vac Sci Technol B 6(2), Mar./Apr. 1988, pp. 524-532.

Cheng, et al., "New Test Structure to Identify Step Coverage Mechanisms in Chemical Vapor Deposition of Silicon Dioxide," Appl. Phys. Lett., 58 (19), May 13, 1991, p. 2147-2149.

C.K. Hu, et al. "Reduced Electromigration of Cu Wires by Surface Coating" Applied Physics Letters, vol. 81, No. 10, Sep. 2, 2002—pp. 1782-1784.

European Search Report dated May 23, 2006 for EP Application No. 05251143.3.

European Examination Report dated Nov. 13, 2007 for EP Application No. 05251143.3 (APPM/008802EP).

EP Partial Search Report, Application No. 08150111.601235/1944796, dated Aug. 22, 2008.

Examination Report dated Jun. 28, 2010 for European Patent Application No. 05251143.3. I (APPM/008802 EPC E).

Eze, F. C., "Eiectroless deposition of CoO thin films," J. Phys. D: Appl. Phys. 32 (1999), pp. 533-540.

Fukada et al. "Preparation of SiOF Films with Low Dielectric Constant by ECR Plasma CVD", ISMIC, DUMIC Conference, Feb. 21-22, 1995, pp. 43-49.

Galiano et al. "Stress-Temperature Behavior of Oxide Films Used for Intermetal Dielectric Applications", VMIC Conference, Jun. 9-10, 1992, pp. 100-106.

Hashim et al.; Characterization of thin oxide removal by RTA Treatment; ICSE 1998 Proc. Nov. 1998, Rangi, Malaysia, pp. 213-216.

Hausmann, et al., "Rapid Vapor Deposition of Highly Conformal Silica Nanolaminates," Science, Oct. 11, 2002, p. 402-406, vol. 298.

Hayasaka, N. et al. "High Quality Low Dielectric Constant SiO2 CVD Using High Density Plasma," Proceedings of the Dry Process Symposium, 1993, pp. 163-168.

Hwang et al., "Smallest Bit-Line Contact of 76nm pitch on NAND Flash Cell by using Reversal PR (Photo Resist) and SADP (Self-Align Double Patterning) Process," IEEE/SEMI Advanced Semiconductor Manufacturing Conference, 2007, 3 pages.

Iijima, et al., "Highly Selective SiO2 Etch Employing Inductively Coupled Hydro-Fluorocarbon Plasma Chemistry for Self Aligned Contact Etch", Jpn. J. Appl. Phys., Sep. 1997, pp. 5498-5501, vol. 36, Part 1, No. 9A.

International Search Report and Written Opinion of the International Searching Authority mailed Jul. 3, 2008 (PCT/US05/46226; APPM8802PC02).

International Search Report and Written Opinion for PCT Application No. PCT/US2011/027221, mailed on Nov. 1, 2011, 8 pages.

International Search Report and Written Opinion of PCT/US2010/057676 mailed on Jun. 27, 2011, 9 pages.

International Search Report and Written Opinion of PCT/US2011/030582 mailed Dec. 7, 2011, 9 pages.

International Search Report and Written Opinion of PCT/US2011/064724 mailed on Oct. 12, 2012, 8 pages.

International Search Report and Written Opinion of PCT/US2012/028952 mailed on Oct. 29, 2012, 9 pages.

International Search Report and Written Opinion of PCT/US2012/048842 mailed on Nov. 28, 2012, 10 pages.

International Search Report and Written Opinion of PCT/US2012/053329 mailed on Feb. 15, 2013, 8 pages.

International Search Report and Written Opinion of PCT/US2012/057294 mailed on Mar. 18, 2013, 12 pages.

International Search Report and Written Opinion of PCT/US2012/057358 mailed on Mar. 25, 2013, 10 pages.

International Search Report and Written Opinion of PCT/US2012/058818 mailed on Apr. 1, 2013, 9 pages.

International Search Report and Written Opinion of the International Searching Authority for PCT Application No. PCT/US2012/028957, mailed on Oct. 18, 2012, 9 pages.

International Search Report of PCT/US2009/059743 mailed on Apr. 26, 2010, 4 pages.

International Search report and Written Opinion of PCT/CN2010/000932 dated Mar. 31, 2011.

International Search report of PCT/US2012/061726 mailed on May 16, 2013, 3 pages.

Japanese Patent Office, Official Action for Application No. 2007-317207 mailed on Dec. 21, 2011, 2 pages.

(56) References Cited

OTHER PUBLICATIONS

Jung, et al., "Patterning with amorphous carbon spacer for expanding the resolution limit of current lithography tool", Proc. SPIE , 2007, 9 pages, vol. 6520, 65201C.

Laxman, "Low $\epsilon$ Dielectrics: CVD Fluorinated Silicon Dioxides", Semiconductor International, May 1995, pp. 71-74.

Lee, et al., "Dielectric Planarization Techniques for Narrow Pitch Multilevel Interconnects," IEEE, V-MIC Conference Jun. 15-16, 1987, pp. 85-92 (1987).

Lin, et al., "Manufacturing of Cu Electroless Nickei/Sn-Pb Flip Chip Solder Bumps", IEEE Transactions on Advanced Packaging, vol. 22, No. 4 (Nov. 1999), pp. 575-579.

Lopatin, et al., "Thin Electroless barrier for copper films", Part of the SPIE Conference of Multilevel Interconnect technology II, SPIE vol. 3508 (1998), pp. 65-77.

Matsuda, et al. "Dual Frequency Plasma CVD Fluorosilicate Glass Deposition for 0.25 um Interlevel Dielectrics", ISMIC, DUMIC Conference Feb. 21-22, 1995, pp. 22-28.

Meeks, Ellen et al., "Modeling of SiO2 deposition in high density plasma reactors and comparisons of model predictions with experimental measurements," J. Vac. Sci. Technol. A, Mar./Apr. 1998, pp. 544-563, vol. 16(2).

Mukai, et al., "A Study of CD Budget in Spacer Patterning Process", Toshiba, SPIE 2008, Feb. 26, 2008, 12 pages.

Musaka, "Single Step Gap Filling Technology fo Subhalf Micron Metal Spacings on Plasma Enhanced TEOS/O2 Chemical Vapor Deposition System," Extended Abstracts of the 1993 International Conference on Solid State Devices and Materials pages, 1993, 510-512.

Nishino, et al.; Damage-Free Selective Etching of Si Native Oxides Using NH3/NF3 and SF6/H20 Down-Flow Etching, The Japanese Society of Applied Physics, vol. 74, No. 2, pp. 1345-1348, XP-002491959, Jul. 15, 1993.

Ogawa, et al., "Dry Cleaning Technology for Removal of Silicon Native Oxide Employing Hot NH3/NF3 Exposure", Japanese Journal of Applied Physics, pp. 5349-5358, Aug. 2002, vol. 41 Part 1, No. 8.

Ota, et al., "Stress Controlled Shallow Trench Isolation Technology to Suppress the Novel Anti-Isotropic Impurity Diffusion for 45nm-Node High Performance CMOSFETs," Symposium on VLSI Technology Digest of Technical Papers, 2005, pp. 138-139.

Pearlstein, Fred. "Eiectroless Plating," J. Res. Natl. Bur. Stan., Ch. 31 (1963), pp. 710-747.

Qian, et al., "High Density Plasma Deposition and Deep Submicron Gap Fill with Low Dielectric Constant SiOF Films," ISMIC, DUMIC Conference Feb. 21-22, 1995, pp. 50-56.

Robles, et al. "Effects of RF Frequency and Deposition Rates on the Moisture Resistance of PECVD TEOS-Based Oxide Films", ECS Extended Abstracts, Abstract No. 129, May 1992, pp. 215-216, vol. 92-1.

Saito, et al., "Eiectroless deposition of Ni-B, Co-B and Ni-Co-B alloys using dimethylamineborane as a reducing agent," Journal of Applied Electrochemistry 28 (1998), pp. 559-563.

Schacham-Diamond, et al., "Electrochemically deposited thin film alloys for ULSI and MEMS applications," Microelectronic Engineering 50 (2000), pp. 525-531.

Schacham-Diamond, et al. "Material properties of electroless 100-200 nm thick CoWP films," Electrochemical Society Proceedings, vol. 99-34, pp. 102-110.

Shapiro, et al. "Dual Frequency Plasma CVD Fluorosilicate Glass: Water Absorption and Stability", ISMIC, DUMIC Conference Feb. 21-22, 1995, pp. 118-123.

Smayling, et al., "APF® Pitch-Halving for 2nm Logic Cells using Gridded Design Rules", proceedings of the SPIE, 2008, 8 pages.

S.M. Sze, VLSI Technology, McGraw-Hill Book Company, pp. 107, 108.

U.S. Appl. No. 60/803,499, filed May 30, 2006, 56 pages.

U.S. Appl. No. 11/875,250, filed Oct. 19, 2007, 36 pages.

Usami, et al., "Low Dielectric Constant Interlayer Using Fluorine-Doped Silicon Oxide", Jpn. J. Appl. Phys., Jan. 19, 1994. pp. 408-412, vol. 33 Part 1, No. 1B.

Vassiliev, et al., "Trends in void-free pre-metal CVD dielectrics," Solid State Technology, Mar. 2001, pp. 129-136.

Wang et al.; Ultra High-selectivity silicon nitride etch process using an inductively coupled plasma source; J. Vac. Sci. Techno!. A 16(3),May/Jun. 1998, pp. 1582-1587.

Weston, et al., "Ammonium Compounds," Kirk-Othmer Encyclopedia of Chemical Technology, 2003,30 pages see pp. 717-718, John Wiley & Sons, Inc.

Wolf et al.; Silicon Processing for the VLSI Era; vol. 1; 1986; Lattice Press, pp. 546, 547, 618, 619.

Yosi Shacham-Diamond, et al. "High Aspect Ratio Quarter-Micron Electroless Copper Integrated Technology", Microelectronic Engineering 37/38 (1997) pp. 77-88.

Yu, et al., "Step Coverage Study of Peteos Deposition for Intermetal Dielectric Applications," abstract, VMIC conference, Jun. 12-13, 1990, 7 pages, No. 82.

Yutaka, et al., "Selective Etching of Silicon Native Oxide with Remote-Plasma-Excited Anhydrous Hydrogen Fluoride," Japanese Journal of Applied Physics, 1998, vol. 37, pp. L536-L538.

\* cited by examiner

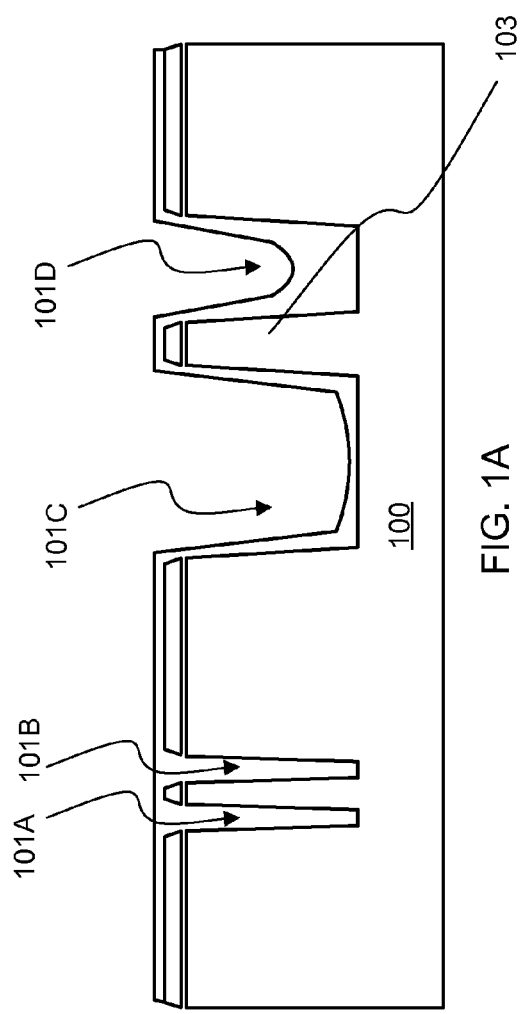
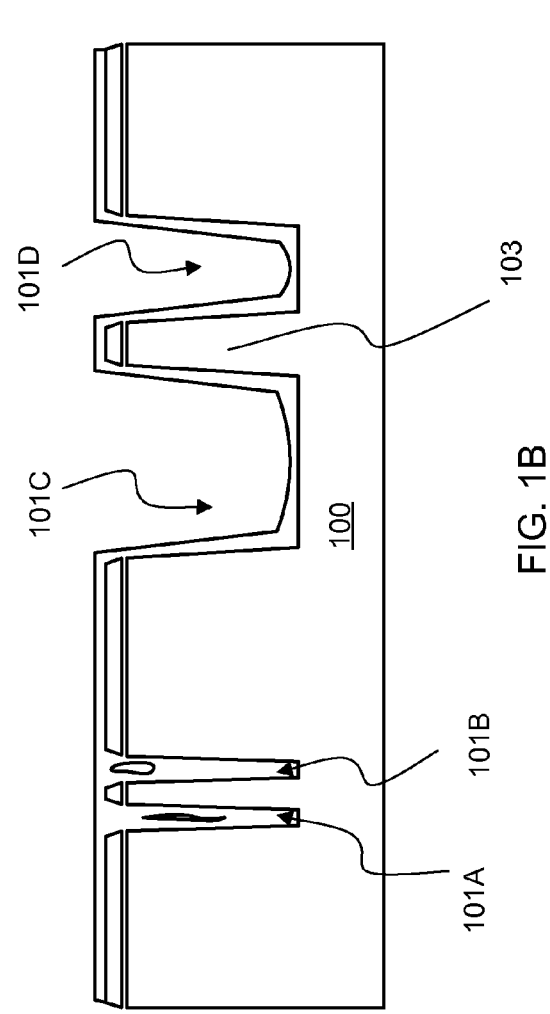

METHODS OF REDUCING SUBSTRATE DISLOCATION DURING GAPFILL PROCESSING

CROSS-REFERENCES TO RELATED APPLICATIONS

This application claims the benefit of U.S. Provisional Application No. 61/557,249, filed Nov. 8, 2011, entitled "Methods of Reducing Substrate Dislocation During Gapfill Processing," the entire disclosure of which is hereby incorporated by reference for all purposes.

FIELD OF THE TECHNOLOGY

The present technology is related to semiconductor manufacturing processes and equipment. More specifically, the present technology is related to semiconductor processing techniques that reduce silicon lattice dislocation in an underlying substrate.

BACKGROUND

Semiconductor device geometries have dramatically decreased in size since their introduction decades ago. Modern semiconductor fabrication equipment routinely produces devices with 45 nm, 32 nm, and 28 nm feature sizes, and new equipment is being developed and implemented to make devices with even smaller geometries. The decreasing feature sizes result in structural features on the device having decreased spatial dimensions. The widths of gaps and trenches on the device have narrowed to a point where the aspect ratio of gap depth to width becomes high enough to make it challenging to fill the gap with dielectric material. Additionally, the portions of the substrate remaining between the gaps and separating them are becoming even thinner.

When dielectric materials are deposited within and over these gaps, they affect the underlying substrate. For example, when a curing operation is performed, some dielectric materials will shrink to an extent, or densify, which may produce a force on the underlying substrate. When gaps of differing widths lie adjacent to one another, unequal forces may be imposed on opposite sides of the divide based on the amount of deposited material.

Thus, there is a need for new fabrication processes and materials that may adequately fill substrate gaps, while maintaining the substrate feature profiles. These and other benefits are provided by the disclosed technology.

BRIEF SUMMARY

Methods of reducing dislocation in a semiconductor substrate between asymmetrical trenches are described. The methods may include etching a plurality of trenches on a semiconductor substrate and may include two adjacent trenches of unequal width separated by an unetched portion of the substrate. The methods may include forming a layer of dielectric material on the substrate. The dielectric material may form a layer in the trenches located adjacent to each other of substantially equivalent height on both sides of the unetched portion of the substrate separating the two trenches. The methods may include densifying the layer of dielectric material so that the densified dielectric within the two trenches of unequal width exerts a substantially similar stress on the unetched portion of the substrate that separates them.

The methods may further include forming the dielectric material over the entire semiconductor substrate during a simultaneous deposition process step. At least one trench etched in the substrate may have a width of less than or about 100 nm, or less than or about 50 nm, and the two trenches of unequal width may have a trench width greater than or about 100 nm, or greater than or about 150 nm.

The dielectric material may be initially flowable when it is deposited on the semiconductor substrate, so that a portion of the dielectric material deposited at the top of a trench flows toward the bottom of the trench. The temperature of the substrate during the forming of the dielectric layer may be maintained below about 100° C., and the processing chamber in which the forming the dielectric occurs may be maintained at a pressure at or below about 50 Torr. In disclosed embodiments the temperature of the substrate during the forming of the dielectric layer may be maintained below about 50° C., and the processing chamber in which the forming the dielectric occurs may be maintained at a pressure at or below about 5 Torr.

The densifying performed may include curing the dielectric material in an ozone ($O_3$) environment, and then annealing the cured dielectric material in a steam environment. The temperature of the substrate during the curing and annealing may be maintained at or below about 400° C., and may be maintained at or below about 200° C. in disclosed embodiments.

The forming of the dielectric layer may further comprise flowing a nitrogen-containing precursor into the semiconductor deposition chamber in which the etched semiconductor substrate resides, and flowing a silicon-containing precursor into the deposition chamber to come into contact with the nitrogen-containing precursor over the etched semiconductor substrate. The nitrogen-containing precursor may include ammonia, and the nitrogen-containing precursor may have been flowed through a remote plasma region prior to entering the semiconductor deposition chamber to create ammonia radicals.

Methods of forming a layer of dielectric material on a patterned semiconductor substrate are also described. The methods may include etching a plurality of trenches on a semiconductor substrate and may include two adjacent trenches of unequal width separated by an unetched portion of the substrate. The methods may include flowing a plurality of precursor gases into the deposition chamber, where the precursor gases include a silicon-containing precursor, a nitrogen-containing precursor, and an inert carrier gas. The flow rate of the nitrogen-containing precursor may be at least about two times the flow rate of the silicon-containing precursor, and the flow rate of the inert carrier gas may be at least about five times the flow rate of the silicon-containing precursor. The methods may include forming a layer of dielectric material on the substrate. The dielectric material may be initially flowable upon deposition so that a portion of the dielectric material deposited near the top of a trench flows toward the bottom of the trench. The methods may further include densifying the layer of dielectric material so that the densified dielectric within the two trenches of unequal width exerts a substantially similar stress on the unetched portion of the substrate that separates them.

Additional embodiments and features are set forth in part in the description that follows, and in part will become apparent to those skilled in the art upon examination of the specification or may be learned by the practice of the technology. The features and advantages of the technology may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

FIG. 1A shows a cross-sectional view of a semiconductor substrate on which a dielectric material has been deposited.

FIG. 1B shows a cross-sectional view of a semiconductor substrate on which a dielectric material has been deposited.

Figure 2:
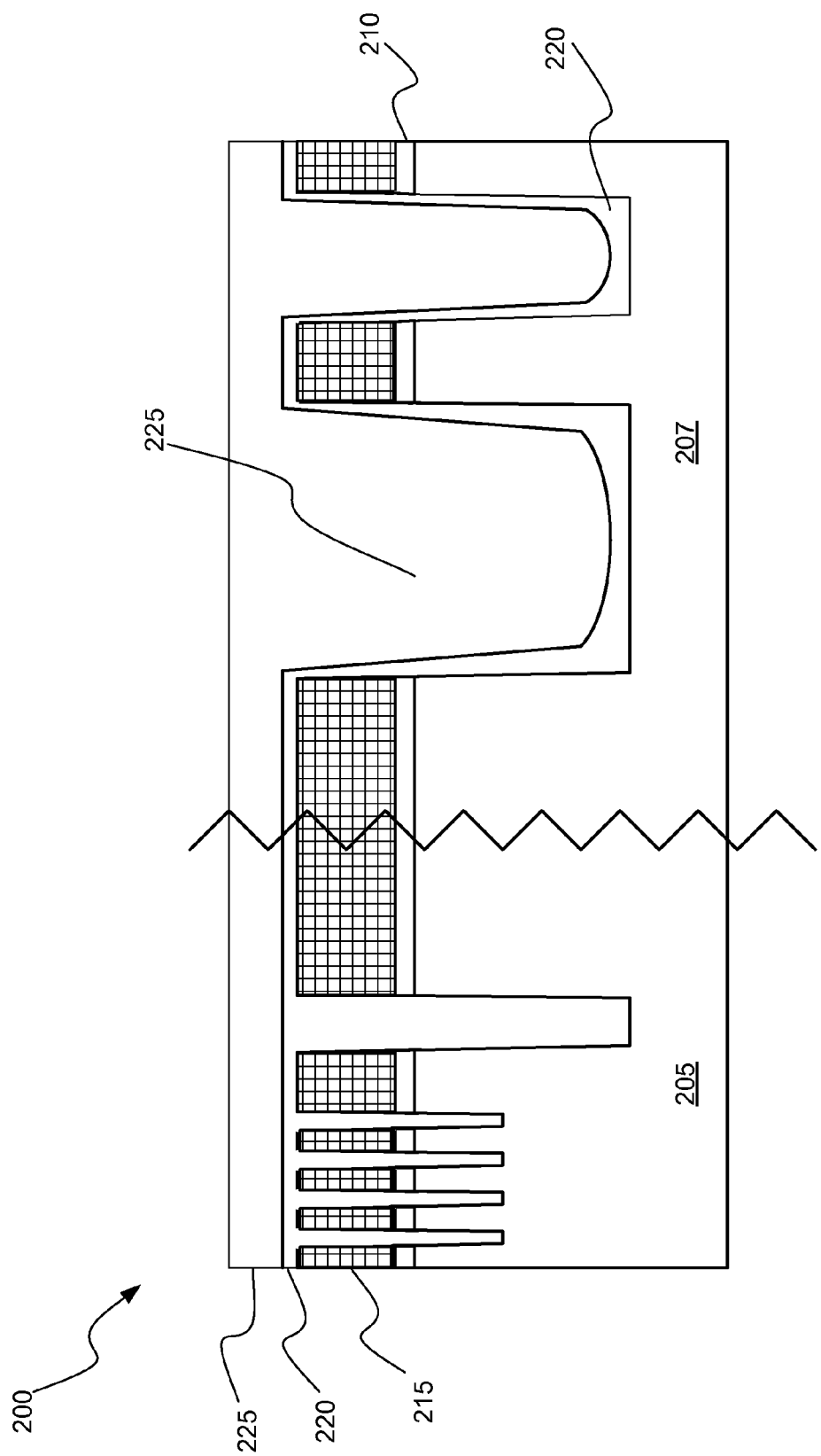
FIG. 2 shows a cross-sectional view of a semiconductor substrate on which methods according to disclosed embodiments have been performed.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Methods are described herein for reducing dislocation of a silicon lattice in a semiconductor substrate on which trench filling is performed simultaneously in both dense and less densely patterned regions. The methods allow for the forming of a dielectric layer on a semiconductor substrate that has both a densely patterned region as well as a region having wider trenches. The two regions may have the dielectric material formed simultaneously in a single deposition processing step. The deposition may allow the trenches in the dense region to be substantially filled with the dielectric material without the formation of voids or seams, while filling wider trenches in the other region to a substantially equivalent height. A substantially equivalent height, regardless of the width of the trenches, may provide a reduction of dislocation of the substrate in the region with wider trenches during a subsequent densification of the dielectric material.

Dielectric layers deposited on substrates during semiconductor fabrication may take a variety of forms. For example, more flowable films may be used to fill narrow gaps, but may deposit a less dense, lower quality film. Conformal films may be used to fill wider trenches with a denser dielectric layer, but may create voids or seams if utilized for filling narrow trenches. Another potential issue with some flowable films is that if a thick film is deposited, subsequent densification of the film may create large stresses that are imposed on the underlying substrate. By creating a more conformal dielectric film that also possesses flowable properties, a dielectric may be formed that fills a narrow trench without voids, while at the same time produces a substantially conformal fill of wider trenches.

For example, as shown in FIG. 1A, a semiconductor substrate 100 may have a region with several narrow trenches 101A, 101B and a separate region with wider trenches 101C, 101D. If a more conventional flowable film is used for gap-filling over the entire substrate, narrow gaps 101A, 101B may be filled seamlessly because the deposited film may initially flow when deposited from the tops of the trenches towards the bottom. However, as may occur with flowable dielectrics, in wider trenches 101C, 101D an equivalent volume of dielectric may be deposited in both trenches. Hence, less wide trench 101D may be filled to a greater height than wider trench 101C. Because flowable films have a lower density, the subsequent densification of the film may be accompanied by film shrinkage. As the film shrinks, a stress is imposed on the underlying substrate. The more material that shrinks, i.e. a trench that is filled to a greater height, the more stress may be imposed on the substrate. Hence for trenches of unequal width 101C, 101D the portion of the substrate in between the trenches 103 may have a disproportionate stress imposed on each side due to the unequal height of the fill. If the stress is great enough, the structure of the substrate, e.g., a silicon lattice, may have deformation occur or stacking faults form, which may weaken the integrity of the substrate. In more extreme cases, this deformation may result in unetched portion 103 collapsing.

Alternatively, as shown in FIG. 1B, the same substrate trenches may be filled with a more conventional conformal film that fills trenches from the sidewalls in toward the center, regardless of the width of the trench. A higher quality film may be formed that fills wider trenches 101C, 101D to a substantially similar height, thereby producing a substantially equivalent stress on the unetched portion of the substrate 103 between the two trenches. However, in the narrower trenches 101A, 101B, the more conformal filling that forms from the sidewalls of the trench towards the center, may produce seams or breadloafing, which occurs when the film pinches off the top of the trench despite that the trench has not been filled. Because of these issues occurring between narrower and wider trenches, many conventional methods of substrate processing may involve separately patterning and subsequently filling more densely patterned regions of the substrate separately from less densely patterned regions. In this way, a more flowable film may be used for deposition in the narrow regions, and a more conformal film may be used for deposition in the wider regions. The inventors have surprisingly found that a more conformal film displaying flowable properties may be able to overcome the separate issues described above, and be used to fill narrow trenches without producing voids, while filling wider trenches in a more conformal manner to a similar height.

Methods of reducing dislocation in a semiconductor substrate between asymmetrical trenches are described. The methods may include etching a plurality of trenches on a semiconductor substrate, and may include two adjacent trenches of unequal width that are separated by an unetched portion of the substrate. The methods may further include forming a layer of dielectric material on the substrate. The dielectric material may form a substantially uniform layer in the trenches so that the two trenches of unequal width are filled to a substantially equivalent height on both sides of the unetched portion of the substrate separating them. The methods may include densifying the layer of dielectric material so that the densified dielectric within the two trenches of unequal width exerts a substantially similar stress on the unetched portion of the substrate that separates them.

FIG. 2 is a cross-sectional view of a semiconductor substrate 200. Although not to scale, the substrate illustrates two configured regions 205 and 207. In one embodiment, the substrate may represent the cell region and periphery circuit region of a flash semiconductor substrate. A manufacturing process may be performed to create the structure as illustrated in the figure, and described herein. An insulating layer of dielectric material 210 may be deposited on the substrate regions 205, 207 and may serve as an insulating layer, or tunnel oxide as it is referred for a cell region and a gate insulating layer in a peripheral region. The tunnel oxide 210 may be a high quality dielectric such as a thermal oxide, or may alternatively be deposited by other HDP-CVD or LPCVD processes. The tunnel oxide 210 may be any high quality oxide, and may be, for example, a thermally grown silicon oxide.

For semiconductor substrates used for flash devices such as NAND type flash, gate electrodes may be formed in both the cell region and the peripheral circuit region. A floating gate material 215 may be deposited on the tunnel oxide 210. The floating gate material 215 may be a polysilicon, silicon nitride, silicon oxide, or silicon oxy-nitride, a metalized oxide, or another material that may limit back-tunneling of stored charge. The floating gate material 215 may be deposited by an HDP-CVD, LPCVD, PVD, or other process for depositing suitable films.

Subsequent deposition of protective layers such as a nitride stop-layer, and an oxide mask layer (neither shown) may be deposited. The mask layer may be deposited to create a pattern for the isolation of structures on the substrate. As shown in FIG. 2, trenches may be etched in both the cell region 205 and the peripheral circuit region 207. The trenches may be of various depths and widths, and may be from less than about 10 nm in width to more than about 2 μm in width. The trenches etched in the cell region may have cell widths that are less than about 200 nm, and may also be less than about 150 nm, about 100 nm, about 80 nm, about 60 nm, about 50 nm, about 40 nm, about 30 nm, about 20 nm, about 10 nm, etc. or less. The trenches in the periphery circuit region may have cell widths that are greater than about 100 nm, and may also be greater than about 150 nm, about 200 nm, about 350 nm, about 500 nm, about 750 nm, about 1 μm, about 1.5 μm, about 2 μm, etc. or more.

The patterning may be performed simultaneously over both the dense cell region as well as the peripheral circuit region thereby reducing the number of processing steps required for the manufacturing of the substrate. The trenches etched in the structure may vary between the cell region and the peripheral circuit region. For example, the trenches etched in the cell region may have trench widths that are less than about 50 nanometers, while the trenches etched in the peripheral circuit region may have trench widths that are greater than about 150 nm wide.

After the trenches have been etched, a dielectric material 220 may be deposited to create isolation regions on the semiconductor substrate. The dielectric may be deposited simultaneously on both the dense cell region of the substrate and the peripheral region that may contain wider trenches. The dielectric material 220 may exhibit a balance between flowable and conformal properties so that it may display the following properties: the dielectric may substantially fill the trenches in the dense cell region without producing voids or seams, and may also form a layer of dielectric in the peripheral region that may fill trenches of different width to a substantially equivalent height. The filling of the dense cell regions without voids and seams may be performed by utilizing a dielectric material that displays flowable properties upon deposition such that a portion of the dielectric material deposited near the top of the trench flows toward the bottom. The dielectric material may also be limited in the flowable properties such that dielectric material deposited in the peripheral circuit region may fill asymmetrical trenches to a substantially equivalent height. The balance of properties may be provided by increasing the amount of a radical precursor gas and carrier gas, which provides a more conformal deposition to a flowable film.

After the dielectric material 220 has been deposited, a second layer of dielectric material 225, or a capping layer, may be deposited that fills the trenches in the peripheral region as well as completing the filling of any trenches in the cell region that were not filled by the initial dielectric material 220. The capping layer 225 may be deposited in the same or a different manner as dielectric 220, and may be deposited via HARP or E-HARP, for example. Subsequent to the deposition of the dielectric material layers, additional processing steps may be performed. For example, an etching or planarization step may be performed in order to remove excess material and expose the floating gate dielectric 215 in the cell region 205. An inter-gate dielectric may be deposited thereon in preparation for the deposition of a control gate to create a stacked gate structure in the cell region. The peripheral circuit region may contain electrodes of a single gate structure. Additional materials may then be deposited to form additional layers of structure.

Figure 3:
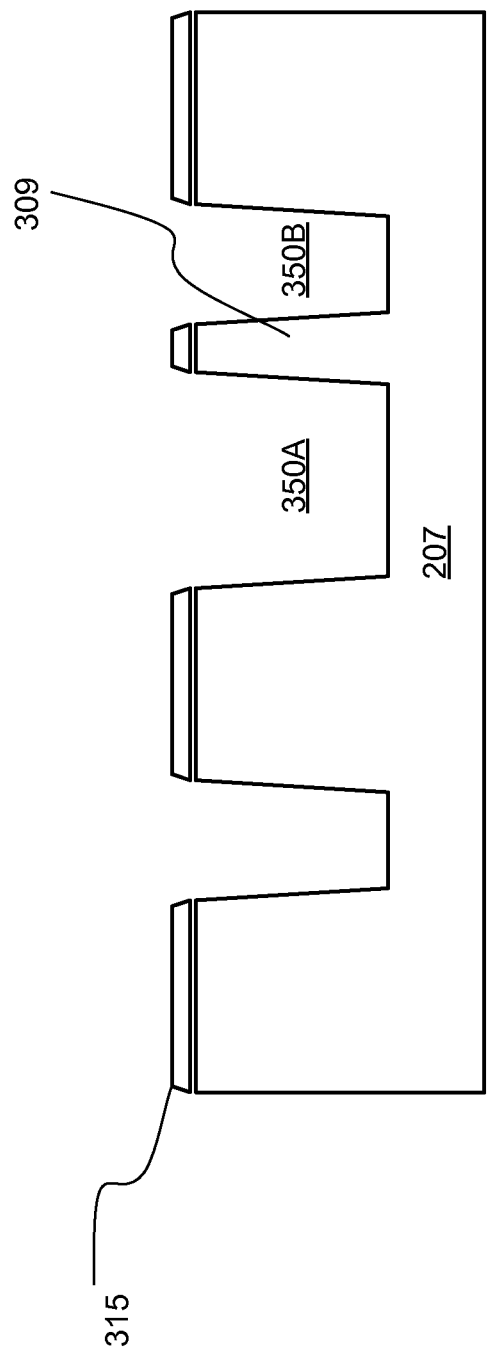
FIG. 3 shows a cross-sectional view of a semiconductor substrate on which trenches have been etched.

The peripheral region 207 may have multiple trenches etched, as illustrated in FIG. 3. For example, the peripheral circuit region 207 may include two trenches of unequal width 350A, 350B that are located adjacently to one another. The trenches are thus separated by an unetched portion of the semiconductor substrate 309. Because flowable dielectrics may deposit a certain volume of dielectric material, if a general flowable dielectric were deposited in the trenches, the wider trench 350A may not be filled to the same height as the other trench 350B, because the same amount of dielectric deposited in each trench would fill to a disparate height. Were this to happen, when the deposited film was cured, an unequal stress may be imposed on each side of the unetched portion of the semiconductor substrate 309. In certain scenarios, the unequal stress may create stacking faults or dislocation within the silicon lattice, or may even cause the structure 309 to deform. Thus, the dielectric material that may be used in the trenches may be less flowable so that the dielectric material fills the trenches of unequal width 350A, 350B to a substantially similar height, although the material may still display flowable properties.

Figure 4:
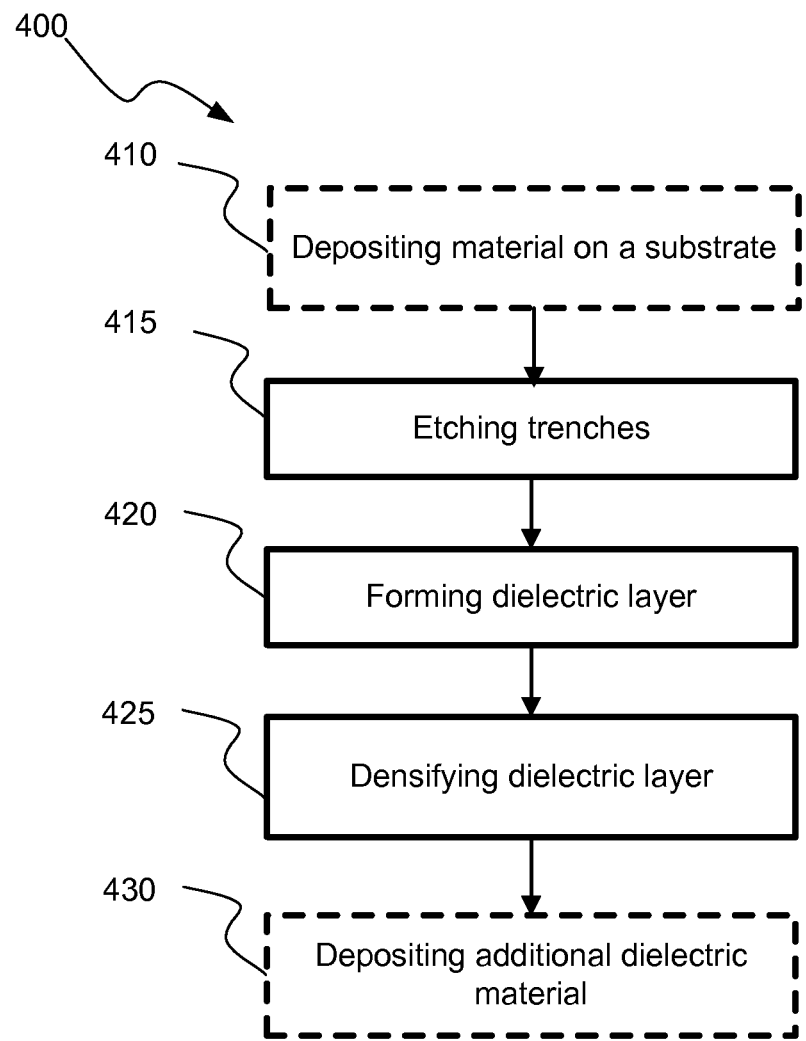
FIG. 4 shows a flowchart of a method of reducing dislocation caused by a deposited dielectric material on a semiconductor substrate.

FIG. 4 shows a method 400 for reducing dislocation caused by a deposited dielectric material on a semiconductor substrate. The semiconductor substrate may be an unpatterned or patterned substrate, e.g. an unpatterned 300 mm silicon wafer for use as a nonvolatile semiconductor memory device such as a NAND type flash device. The method may initially include the optional step 410 of depositing material on the semiconductor substrate. The deposition 410 may include an initial layer of dielectric material that may function as a tunnel oxide, for example. A gate material such as, for example, polysilicon may be deposited on the tunnel oxide. Additional protective material and mask material may be deposited to form a pattern for etching.

Trenches may be etched 415 that create trenches for use in both a cell region of the substrate as well as a peripheral circuit region on the substrate. The trenches may be of various widths, and the trenches in the peripheral circuit region may be wider than the trenches etched in the cell region. The trenches may be etched in both the cell region and the peripheral circuit region simultaneously to limit the number of processing steps required overall. The trenches etched in the peripheral region may include two adjacent trenches of unequal width that are separated by an unetched portion of the semiconductor substrate.

A dielectric layer may be formed 420 over the semiconductor substrate on both the cell region and the peripheral circuit region. The dielectric material may be deposited by a CVD process and display flowable properties such that a portion of the dielectric material deposited near the top of a trench flows toward the bottom. Additionally, the dielectric material may form in the peripheral circuit region such that the adjacent trenches of unequal width are filled to a substantially similar height.

Subsequent to the deposition of the dielectric material, the dielectric may be densified 425 to convert the structure that may include Si—H and Si—N bonds to Si—O bond, and reduce the porosity of the dielectric material. The densification may include a curing performed in an ozone environment as well as an annealing performed in a steam environment. The curing and annealing may be performed while the temperature of the substrate is maintained below about 600° C., or alternatively below about 500° C., about 400° C., about 300° C., about 200° C., about 100° C., etc. or less. Alternatively, the curing step may be performed while the temperature of the substrate is maintained between about 100° C. and about 300° C., or between about 150° C. and about 200° C. The annealing step may be performed while the temperature of the substrate is maintained between about 100° C. and about 500° C., or between about 200° C. and about 400° C. The densification may result in a shrinkage of the deposited dielectric. As the material shrinks, the material may impose a tensile stress on the surrounding substrate structure. The lattice structure of the substrate may deform to an extent to address the imposed stress, and may shift to accommodate the stress. In areas where a disproportionate stress is imposed on the same structure, such as, for example, in adjacent trenches of unequal width, the competing stresses of differing magnitude may cause dislocations and/or stacking faults in the underlying structure, which may cause the substrate to deform or collapse. Thus, the height of the dielectric material deposited in the trenches may be substantially equal to reduce the chance of deformation.

Additional dielectric materials may be deposited 430 to fill any remaining trench volume on the substrate. The additional material may be deposited by a similar process, or alternatively may be deposited with a separate deposition technique such as, for example, a CVD technique such as E-HARP. The additional material may also be annealed after deposition and, the annealing may be performed above about 600° C., or alternatively above about 700° C., about 800° C., about 900° C., about 1000° C., about 1200° C., etc. or more.

Methods are also described for forming a layer of dielectric material on a patterned semiconductor substrate. The methods may include etching a plurality of trenches on a semiconductor substrate to form a pattern. The pattern may have a cell region of the substrate and a periphery circuit region of the substrate. The plurality of trenches may include at least two trenches in the periphery circuit region that are of unequal width and are located adjacent to each other such that an unetched portion of the substrate separates the two trenches. The plurality of trenches may also include at least one trench in the cell region of the substrate. The methods may include flowing a plurality of precursor gases into the deposition chamber, where the precursor gases include a silicon containing precursor, a nitrogen containing precursor, and an inert carrier gas. The flow rate of the nitrogen containing precursor may be at least about two times the flow rate of the silicon containing precursor, and the flow rate of the inert carrier gas may be at least about five times the flow rate of the silicon containing precursor. The methods may also include forming a layer of dielectric material on the semiconductor substrate on both the cell region and the periphery circuit region simultaneously. The dielectric material may be initially flowable upon deposition so that a portion of the dielectric material deposited near the top of a trench flows toward the bottom of the trench. The methods may further include subsequently densifying the layer of dielectric material.

The precursor gases may include a silicon-based precursor, and may include silyl-amines such as $H_2N(SiH_3)$, $HN(SiH_3)_2$, and $N(SiH_3)_3$, among other silyl-amines. These silyl-amines may be mixed with additional gases that may act as carrier gases, reactive gases, or both. Examples of carbon-free silicon precursors may also include silane ($SiH_4$) either alone or mixed with other silicon (e.g., $N(SiH_3)_3$), hydrogen (e.g., $H_2$), and/or nitrogen (e.g., $N_2$, $NH_3$) containing gases. The silicon-containing precursors may also include silicon compounds that have no carbon or nitrogen, such as silane, disilane, etc. If the deposited oxide film is a doped oxide film, dopant precursors may also be used such as TEB, TMB, $B_2H_6$, TEPO, $PH_3$, $P_2H_6$, and TMP, among other boron and phosphorous dopants. The flow rate of the silicon precursor may be greater than or about 100 sccm, greater than or about 200 sccm, greater than or about 250 sccm, greater than or about 275 sccm, greater than or about 300 sccm, greater than or about 350 sccm, greater than or about 400 sccm, etc. or more in different embodiments The precursors may include a nitrogen based precursor, and may include nitrogen as a radical precursor that passes through a remote plasma region prior to entering into the deposition chamber. When nitrogen is present in the radical precursor, it may be referred to as a radical-nitrogen precursor. The radical-nitrogen precursor includes plasma effluents created by exciting a more stable nitrogen-containing precursor in a plasma. For example, a relatively stable nitrogen-containing precursor containing $NH_3$ and/or hydrazine ($N_2H_4$) may be activated in a chamber plasma region or a remote plasma system (RPS) outside the processing chamber to form the radical-nitrogen precursor, which is then transported into a plasma-free substrate processing region. The stable nitrogen precursor may also be a mixture comprising $NH_3$ and $N_2$; $NH_3$ and $H_2$; $NH_3$, $N_2$, and $H_2$; and $N_2$ and $H_2$, in different embodiments. Hydrazine may also be used in place of or in combination with $NH_3$ in the mixtures with $N_2$ and $H_2$. The flow rate of the stable nitrogen precursor may be greater than or about 300 sccm, greater than or about 400 sccm, greater than or about 500 sccm, greater than or about 600 sccm, greater than or about 650 sccm, greater than or about 700 sccm, greater than or about 750 sccm, greater than or about 800 sccm, etc. or more in different embodiments. Nitrogen-containing precursors may also include $N_2O$, NO, $NO_2$ and $NH_4OH$. The radical-nitrogen precursor produced may include one or more of —N, —NH, —$NH_2$, etc., and may also be accompanied by ionized species formed in the plasma. In other embodiments, the radical-nitrogen precursor is generated in a section of the processing chamber partitioned from the substrate processing region where the precursors mix and react to deposit the silicon-and-nitrogen layer on a deposition substrate (e.g., a semiconductor wafer). The partition may be interchangeably referred to as a showerhead. The radical-nitrogen precursor may also be accompanied by a carrier gas such as argon, helium, etc.

The flowability may be due, at least in part, to a significant hydrogen component in the deposited film. For example the deposited film may have a silazane-type, Si—NH—Si backbone (i.e., a Si—N—H film). Flowability may also result from short chained polymers of the silazane type. The nitrogen which allows the formation of short chained polymers and flowability may originate from either the radical precursor or the silicon-containing precursor. When both the silicon precursor and the radical-nitrogen precursor are carbon-free, the deposited silicon-and-nitrogen-containing film is also substantially carbon-free. Of course, "carbon-free" does not necessarily mean the film lacks even trace amounts of carbon. Carbon contaminants may be present in the precursor materials that find their way into the deposited silicon-and-nitrogen-containing film. The amount of these carbon impurities however are much less than would be found in a silicon precursor having a carbon moiety (e.g., TEOS, TMDSO, etc.).

One or more additional gases and carrier gases may be included with the precursors, such as $O_2$, $H_2O$, Ar, $H_2$, $N_2$, He, etc., and may have a flow rate that is greater than or about 100 sccm. Alternatively, the one or more carrier gases may have a flow rate that is greater than or about 200 sccm, greater than or about 500 sccm, greater than or about 750 sccm, greater than or about 1000 sccm, greater than or about 1500 sccm, greater than or about 2000 sccm, greater than or about 2500 sccm, greater than or about 3000 sccm, greater than or about 3500 sccm, etc. or more. Additional gases including molecular oxygen, ozone, and/or water vapor may be included with the precursor gases as well.

Without being limited to any particular theory, the ability to produce a substantially conformal film that displays flowable film properties may be a result of an increase of ammonia radicals during the deposition process. The increase in ammonia radicals may be as a result of increasing the amount of ammonia and carrier gas delivered to the processing chamber. The increased amount of ammonia provides additional gas from which the radicals may be formed, and the increased amount of carrier gas may allow for a greater amount of dissociation from the ammonia. Hence, an enhanced amount of ammonia radials may be created and may produce a more conformal film when deposited. A conformal film that displays flowable properties may be produced from the precursor gases as a function of the silicon precursor gas used. For example, the nitrogen containing precursor, which may be ammonia in one embodiment, may have a flow rate that is at least about two times the flow rate of the silicon containing precursor. Alternatively, the nitrogen containing precursor may be at least about 2.1, about 2.2, about 2.3, about 2.4, about 2.5, about 2.6, about 2.7, about 2.8, about 2.9, about 3, about 3.5, about 4, or about 5 times the flow rate of the silicon containing precursor. Additionally, the carrier gas may be at least about five times the flow rate of the silicon containing precursor. Alternatively, the carrier gas may be at least about 6, about 7, about 8, about 9, about 10, about 11, about 12, about 13, about 15, about 17, about 20, or about 25 times the flow rate of the silicon containing precursor.

The deposition may be performed in a deposition chamber in which the temperature of the substrate is maintained below about 600° C., or alternatively below about 500° C., about 400° C., about 300° C., about 200° C., about 100° C., about 75° C., about 65° C., about 50° C., about 40° C., about 30° C., etc. or less. The pressure maintained in the chamber may be at or below about 760 Torr, and may alternatively be below about 600 Torr, about 400 Torr, about 200 Torr, about 100 Torr, about 50 Torr, about 25 Torr, about 15 Torr, about 10 Torr, about 8 Torr, about 6 Torr, about 5 Torr, about 4 Torr, about 3 Torr, about 2 Torr, about 1 Torr, about 0.5 Torr, etc. or less.

In the preceding description, for the purposes of explanation, numerous details have been set forth in order to provide an understanding of various embodiments of the present invention. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

It is noted that individual embodiments may be described as a process which is depicted as a flowchart, a flow diagram, or a block diagram. Although a flowchart may describe the method as a sequential process, many of the operations may be performed in parallel or concurrently. In addition, the order of the operations may be rearranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Where a range of values is provided, it is understood that each intervening value between the upper and lower limits of that range is also specifically disclosed, to the smallest fraction of the unit or value of the lower limit, unless the context clearly dictates otherwise. Any encompassed range between any stated value or intervening value in a stated range and any other stated or intervening value in that stated range is disclosed. The upper and lower limits of those smaller ranges may independently be included or excluded in the range, and each range where either, neither, or both limits are included in the smaller range is also disclosed and encompassed within the technology, subject to any specifically excluded limit, value, or encompassed range in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a dielectric material" includes a plurality of such materials, and reference to "the process" includes reference to one or more processes and equivalents thereof known to those skilled in the art, and so forth.

Also, the words "comprise", "comprising", "include", "including", and "includes", when used in this specification and in the following claims, are intended to specify the presence of stated features, integers, components, or steps, but they do not preclude the presence or addition of one or more other features, integers, components, steps, acts, or groups.

What is claimed is:
1. A method of forming a layer of dielectric material on a patterned semiconductor substrate, the method comprising:
  etching a plurality of trenches on a semiconductor substrate, wherein the plurality of trenches includes two trenches that are of unequal width and are located adjacent to each other such that an unetched portion of the substrate separates the two trenches of unequal width;
  forming a layer of dielectric material on the semiconductor substrate, wherein the dielectric material forms a layer in the trenches located adjacent to each other of substantially equivalent height on both sides of the unetched portion of the substrate separating the two trenches; and
  densifying the layer of dielectric material, wherein the densified dielectric within the two trenches of unequal width exerts substantially equal stress on the unetched portion of the substrate;

wherein the densifying comprises:
  curing the dielectric material in an ozone ($O_3$) environment; and
  annealing the cured dielectric material in a steam environment;
wherein the forming of the dielectric layer further comprises:
  flowing a nitrogen-containing precursor into a semiconductor deposition chamber in which the etched semiconductor substrate resides; and
  flowing a silicon-containing precursor into the deposition chamber to come into contact with the nitrogen-containing precursor over the etched semiconductor substrate.

2. The method of claim 1, wherein the layer of dielectric material is initially formed over the entire semiconductor substrate during a simultaneous deposition process step.

3. The method of claim 1, wherein at least one trench etched in the substrate has a trench width less than about 100 nanometers, and wherein the two trenches of unequal width have a trench width greater than about 100 nanometers.

4. The method of claim 3, wherein at least one trench etched in the substrate has a trench width less than about 50 nanometers, and wherein the two trenches of unequal width have a trench width greater than about 150 nanometers.

5. The method of claim 1, wherein the dielectric material is initially flowable when it is deposited on the semiconductor substrate so that a portion of the dielectric material deposited at the top of a trench flows toward the bottom of the trench.

6. The method of claim 1, wherein the temperature of the substrate during the forming of the dielectric layer is maintained below about 100° C., and wherein the forming of the dielectric layer on the substrate occurs in a processing chamber having a pressure below about 50 Torr.

7. The method of claim 6, wherein the temperature of the substrate during the forming of the dielectric layer is maintained below about 50° C., and wherein the forming of the dielectric layer on the substrate occurs in a processing chamber having a pressure below about 5 Torr.

8. The method of claim 1, wherein the temperature of the substrate during the curing and annealing is maintained at or below about 400° C.

9. The method of claim 8, wherein the temperature of the substrate during the curing is maintained at or below about 200° C.

10. The method of claim 1, wherein the nitrogen-containing precursor is ammonia.

11. The method of claim 10, wherein the ammonia has been flowed through a remote plasma region prior to entering the semiconductor deposition chamber to create ammonia radicals.

12. A method of forming a layer of dielectric material on a patterned semiconductor substrate, the method comprising:
  etching a plurality of trenches on a semiconductor substrate, wherein the plurality of trenches includes two trenches that are of unequal width and are located adjacent to each other such that an unetched portion of the substrate separates the two trenches of unequal width;
  flowing a plurality of precursor gases into the deposition chamber, wherein:
    the precursor gases comprise a silicon containing precursor, a nitrogen containing precursor, and an inert carrier gas,
    the flow rate of the nitrogen containing precursor is at least about two times the flow rate of the silicon containing precursor, and
    the flow rate of the inert carrier gas is at least about five times the flow rate of the silicon containing precursor;
  forming a layer of dielectric material on the semiconductor substrate, wherein the dielectric material is initially flowable upon deposition so that a portion of the dielectric material deposited near the top of a trench flows toward the bottom of the trench; and
  densifying the layer of dielectric material;
  wherein the formed dielectric layer forms a layer in the trenches located adjacent to each other of substantially equivalent height on both sides of the unetched portion of the substrate separating the two trenches;
  wherein the densifying comprises:
  curing the dielectric material in an ozone (O3) environment; and
  annealing the cured dielectric material in a steam environment.

13. The method of claim 12, wherein the densified dielectric within the two trenches of unequal width exerts substantially equal stress on the unetched portion of the substrate.

14. The method of claim 12, wherein the temperature of the substrate during the curing and annealing is maintained at or below about 400° C.

15. The method of claim 12, wherein the nitrogen-containing precursor is ammonia.

16. The method of claim 15, wherein the ammonia has been flowed through a remote plasma region prior to entering the semiconductor deposition chamber to create ammonia radicals.

* * * * *